United States Patent [19]

Takahashi et al.

[11] 4,393,188
[45] Jul. 12, 1983

[54] THERMOSETTING PREPOLYMER FROM POLYFUNCTIONAL MALEIMIDE AND BIS MALEIMIDE

[75] Inventors: Akio Takahashi, Hitachiohta; Motoyo Wajima, Hitachi; Ritsuro Tada, Mito; Hirosada Morishita, Hitachi; Yutaka Mizuno, Shimodate; Shunya Yokozawa, Oyama; Kenji Tsukanishi, Shimodate, all of Japan

[73] Assignee: Hitachi Chemical Company, Ltd., Japan

[21] Appl. No.: 233,746

[22] Filed: Feb. 12, 1981

[30] Foreign Application Priority Data

Feb. 14, 1980 [JP] Japan .................................. 55-18094

[51] Int. Cl.$^3$ ...................... C08G 59/06; G08G 59/08
[52] U.S. Cl. ...................................... 528/88; 525/404; 525/408; 525/422; 525/530; 528/108; 528/116; 528/117; 528/317; 528/321; 528/322; 428/413; 428/473.5
[58] Field of Search ................ 528/322, 88, 108, 116, 528/117, 317, 321; 525/422, 404, 408, 530

[56] References Cited

U.S. PATENT DOCUMENTS

| Re. 29,316 | 7/1977 | Bargain et al. | 260/30.2 |
|---|---|---|---|
| 3,637,901 | 1/1972 | Bargain et al. | 260/830 P |
| 3,658,764 | 4/1972 | Bargain et al. | 260/78 UA |
| 3,883,486 | 5/1975 | Bargain et al. | 260/78 UA |
| 3,998,904 | 12/1976 | Balme et al. | 260/830 R |
| 4,005,154 | 1/1977 | Bargain | 525/422 |
| 4,237,262 | 12/1980 | Jones | 525/422 |
| 4,273,916 | 6/1981 | Jones | 525/422 |
| 4,283,522 | 8/1981 | Takahashi et al. | 528/322 |

Primary Examiner—Harold D. Anderson
Attorney, Agent, or Firm—Sprung, Horn, Kramer & Woods

[57] ABSTRACT

A process for preparing a thermosetting maleimide type prepolymer which comprises reacting (A) a polyfunctional maleimide compound, (B) a bis-maleimide, (C) a diamine and (D) an epoxy compound. The maleimide type prepolymer prepared according to the process of the present invention has rapid curability and excellent solubility in low boiling point solvents such as acetone, methyl ethyl ketone and methyl cellosolve, which are available at low cost. Accordingly, the prepolymer is advantageously used especially for the production of laminated boards having good heat resisting properties, low moisture absorption and good adhesion to various substrates such as a copper foil.

8 Claims, No Drawings

THERMOSETTING PREPOLYMER FROM POLYFUNCTIONAL MALEIMIDE AND BIS MALEIMIDE

The present invention relates to a process for the preparation of a maleimide type prepolymer. More particularly, the invention relates to a process for preparing a thermosetting maleimide type prepolymer with high solubility in ordinary low boiling point organic solvents such as acetone, methyl ethyl ketone and methyl cellosolve, with rapid curability and with excellent physical properties after curing, such as excellent heat resisting properties, low moisture absorption and good adhesion to various substrates, e.g., a copper foil. Such a prepolymer may be used in a varnish for the impregnation of a base material in the manufacture of insulating laminated boards, said varnish being good in workability.

Polyimide type resins have heretofore been used in printed circuit boards employed in the fields where high heat resistance and high environmental resistance are required thereof. Dehydrocondensation polyimides and amine-cured maleimide type polyimides are well known as thermoset polyimide type resins having excellent heat resisting properties and classified as having class H or C insulation properties according to JIS (Japanese Industrial Standard) C 4003 (resistance to temperature of 180° C. or more). The latter amine-cured maleimide type polyimides have been increasingly used because they do not involve problems such as the formation of condensation water, poor curability and poor moldability.

In the preparation of amine-cured maleimide type polyimides, amino-bis-maleimides having a bis-maleimide skeletal structure are mainly used. The amino-bis-maleimides are prepolymers prepared by the addition-reaction of a diamine with a bis-maleimide at the double bonds thereof. They are subjected to complex cross-linking upon heating which leads to an addition-reaction between an amine moiety and a double bond and radical polymerization via the double bonds. Substantially solvent-insoluble and infusible polymers having excellent heat resisting properties can be formed in this way.

However, conventional amino-bis-maleimide prepolymers cannot dissolve in ordinary solvents other than special solvents such as N-methyl-2-pyrrolidone and N,N'-dimethylformamide. These are highly dipolar and have high boiling points. They are also very costly. The use of such special solvents to form solutions of the prepolymers therefore presents various problems. For example, where such conventional prepolymers are used in the form of solutions for the production of laminated boards, the following problems are encountered from the viewpoints of workability and the properties of the laminated boards. At the time of application of the solution to a base material such as glass cloth or paper, the solvent is splashed on workers and the splashed solvent is very slow in escaping from the workers because of its slow evaporation. Furthermore, an uneven surface of the so-called "prepreg" is liable to be formed in the course of prolonged drying. Unfavourable condensation of the solvent is also liable to occur on the inner wall of a dryer for the prepreg. A small amount of the solvent tends to remain in the laminated board, adversely affecting the characteristics of the board such as its moisture resistance (e.g., in respect of insulating properties) and heat resistance (in respect of flammability and the occurrence of cracking and/or blistering by heating, for example, at the time of any soldering operation). High temperatures and prolonged periods of time are required for complete drying of the prepreg, leading to increases in cost and time for the production of the laminated boards.

The present invention provides a solution to the abovementioned problems. That is, the invention provides a process for preparing a thermosetting maleimide type prepolymer which can be dissolved in a low boiling point organic solvent of low cost such as acetone, methyl ethyl ketone or methyl cellosolve, leading to good workability. Furthermore, upon heat-curing the prepolymer which has rapid curability, a polyimide is formed, having excellent heat resisting properties comparable to those of the polyimides formed from the conventional imide type prepolymers. The polyimide is low in moisture absorption and good in adhesion to substrates such as a copper foil.

More specifically, in accordance with the present invention, there is provided a process for preparing a thermosetting maleimide type prepolymer, which comprises reacting (A) a polyfunctional maleimide compound obtained by the dehydration reaction of an amide acid formed from maleic anhydride and a polyamine prepared by the condensation of aniline with formaldehyde and represented by the formula (1):

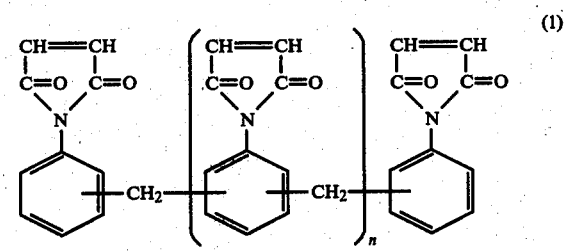

wherein n is in the range of from 0.1 to 3.0, (B) at least one bis-maleimide selected from the group consisting of N,N'-m-phenylene-bis-maleimide, N,N'-p-phenylene-bis-maleimide, N,N'-4,4'-diphenylmethane-bis-maleimide, N,N'-4,4'-diphenyl-ether-bis-maleimide, N,N'-methylene-bis(3-chloro-p-phenylene)-bis-maleimide, N,N'-4,4'-diphenylsulfone-bis-maleimide, N,N'-4,4'-dicyclohexylmethane-bis-maleimide, N,N'-α,α'-4,4'-dimethylenecyclohexane-bis-maleimide, N,N'-m-xylene-bis-maleimide and N,N'-4,4'-diphenylcyclohexane-bis-maleimide, (C) at least one diamine selected from the group consisting of 4,4'-diaminodicyclohexylmethane, 1,4-diaminocyclohexane, 2,6-diaminopyridine, m-phenylenediamine, p-phenylenediamine, 4,4'-diaminodiphenylmethane, 2,2'-bis(4-aminophenyl)propane, benzidine, 4,4'-diaminodiphenylsulfone, bis(4-aminophenyl)methylphosphine oxide, bis(4-aminophenyl)phenylphosphine oxide, bis(4-aminophenyl)methylamine, 1,5-diaminonaphthalene, m-xylylenediamine, p-xylylenediamine, hexamethylenediamine, 6,6'-diamino-2,2'-dipyridyl, 4,4'-diaminobenzophenone, 4,4'-diaminoazobenzene, bis(4-aminophenyl)phenylmethane, 1,1-bis(4-aminophenyl)cyclohexane, 1,1-bis(4-amino-3-methylphenyl)cyclohexane, 2,5-bis(m-aminophenyl)-1,3,4-oxadiazole, 2,5-bis(p-aminophenyl)-1,3,4-oxadiazole, 2,5-bis(m-aminophenyl)thiazolo(4,5- d)thiazole, 5,5'-di(m-aminophenyl)-2,2'-bis(1,3,4-oxadiazolyl), 4,4'-diaminodiphenyl ether, 4,4'-bis(p-aminophenyl)-2,2'-dithiazole, m-bis(4-p-aminophenyl-2-thiazolyl)benzene, 4,4'-diaminobenzanilide, 4,4'-diaminophenyl benzoate, N,N'-bis(4-aminobenzyl)-p-phenylenediamine and 4,4'-methylenebis(2-chloroaniline), and (D) at least one epoxy compound which, when polymeric, has a weight average molecular weight of up to 5,000, under such conditions that a reaction or reactions involving said at least one epoxy compound (D) are carried out at a temperature of 50° to 145° C. for a period of time of 5 to 240 minutes, and that when the process comprises a reaction or reactions not involving said at least one epoxy compound (D), the reaction or reactions not involving said at least one epoxy compound (D) are carried out at a temperature of 70° to 180° C. for a period of time of 5 to 240 minutes; the weight proportion of said polyfunctional maleimide compound (A) relative to the total of said polyfunctional maleimide compound (A) and said at least one bis-maleimide (B) being 3 to 80%, the molar ratio of the total of said polyfunctional maleimide compound (A) and said at least one bis-maleimide (B) relative to said at least one diamine (C) being 1:2 to 1:0.1, and the weight proportion of said at least one epoxy compound (D) relative to the total of said polyfunctional maleimide compound (A), said at least one bis-maleimide (B), said at least one diamine (C) and said at least one epoxy compound (D) being 5 to 80%.

The prepolymers obtained according to the process of the present invention can be dissolved in a low boiling point solvent of low cost such as acetone, methyl ethyl ketone or methyl cellosolve to give a solution having a solids concentration of 40% by weight or more, and form, upon heat-curing, polyimides having heat resisting properties comparable to those of the polyimides formed from the conventional amino-bis-maleimide prepolymers. On the other hand, amino-bis-maleimide prepolymers which are obtained by heating the bis-maleimide (B) and the diamine (C) in the molten state to effect a reaction therebetween, and which are represented by the well known Kerimid 601 (trade name of an amino-bis-maleimide type prepolymer manufactured by Rhone-Poulenc S.A., France) are soluble only in special dipolar solvents such as N-methyl-2-pyrrolidone and N,N'-dimethylformamide.

The polyfunctional maleimide compound (A) to be used in the process of the present invention is obtained by the well-known dehydration reaction of an amide acid formed from maleic anhydride and a polyamine prepared by the condensation of aniline with formaldehyde, and is required to have an average molecular weight corresponding to n in the range of from 0.1 to 3.0, preferably in the range of 0.2 to 2.5, in the formula (1) from the viewpoint of the heat resisting properties of the cross-linked polyimide formed from the prepolymer prepared according to the process of the present invention.

The bis-maleimide (B) to be used in the process of the present invention is selected from N,N'-m-phenylene-bis-maleimide, N,N'-p-phenylene-bis-maleimide, N,N'-4,4'-diphenylmethane-bis-maleimide, N,N'-4,4'-diphenyl-ether-bis-maleimide, N,N'-methylene-bis(3-chloro-p-phenylene)-bis-maleimide, N,N'-4,4'-diphenylsulfone-bis-maleimide, N,N'-4,4'-dicyclohexylmethane-bis-maleimide, N,N'-α,α'-4,4'-dimethylenecyclohexane-bis-maleimide, N,N'-m-xylene-bis-maleimide, N,N'-4,4'-diphenylcyclohexane-bis-maleimide. They may be used either alone or in combination. Preferred are N,N'-4,4'-diphenylmethane-bis-maleimide, N,N'-methylene-bis-(3-chloro-p-phenylene)-bis-maleimide, N,N'-4,4'-diphenylsulfone-bis-maleimide, N,N'-4,4'-diphenyl-ether-bis-maleimide, N,N'-ethylene-bis-maleimide and N,N'-hexamethylene-bis-maleimide.

The diamine (C) to be used in the process of the present invention is selected from 4,4'-diaminodicyclohexylmethane, 1,4-diaminocyclohexane, 2,6-diaminopyridine, m-phenylenediamine, p-phenylenediamine, 4,4'-diaminodiphenylmethane, 2,2'-bis(4-aminophenyl)propane, benzidine, 4,4'-diaminodiphenylsulfone, bis(4-aminophenyl)methylphosphine oxide, bis(4-aminophenyl)phenylphosphine oxide, bis(4-aminophenyl)methylamine, 1,5-diaminonaphthalene, m-xylylenediamine, p-xylylenediamine, hexamethylenediamine, 6,6'-diamino-2,2'-dipyridyl, 4,4'-diaminobenzophenone, 4,4'-diaminoazobenzene, bis(4-aminophenyl)phenylmethane, 1,1-bis(4-aminophenyl)cyclohexane, 1,1-bis(4-amino-3-methylphenyl)cyclohexane, 2,5-bis(m-aminophenyl)-1,3,4-oxadiazole, 2,5-bis(p-aminophenyl)-1,3,4-oxadiazole, 2,5-bis(m-aminophenyl)thiazolo(4,5-d)thiazole, 5,5'-di(m-aminophenyl)-2,2'-bis(1,3,4-oxadiazolyl), 4,4'-diaminodiphenyl ether, 4,4'-bis(p-aminophenyl)-2,2'-dithiazole, m-bis(4-p-aminophenyl-2-thiazolyl)benzene, 4,4'-diaminobenzanilide, 4,4'-diaminophenyl benzoate, N,N'-bis(4-aminobenzyl)-p-phenylenediamine and 4,4'-methylenebis(2-chloroaniline). They may be used either alone or in combination. Preferred are m-phenylenediamine, p-phenylenediamine, 4,4'-diaminodiphenylmethane, 2,2'-bis(4-aminophenyl)propane, 4,4'-diaminodiphenylsulfone, bis(4-aminophenyl)methylphosphine oxide, bis(4-aminophenyl)phenylphosphine oxide, bis(4-aminophenyl)methylamine, p-xylylenediamine, hexamethylenediamine, bis(4-aminophenyl)phenylmethane, 4,4'-diaminodiphenyl ether and 4,4-methylenebis(2-chloroaniline).

As the epoxy compound (D) to be used in the process of the present invention, there can be mentioned, for example, monoepoxy compounds such as phenyl glycidyl ether; diepoxy compounds such as diglycidyl ether of bisphenol A, bisphenol A-epichlorohydrin epoxy resins, 3,4-epoxycyclohexylmethyl 3,4-epoxycyclohexanecarboxylate, 4,4'-(1,2-epoxyethyl)biphenyl, 4,4'-di(1,2-epoxyethyl)diphenyl ether, resorcin diglycidyl ether, bis(2,3-epoxycyclopentyl) ether and N,N'-m-phenylene-bis(4,5-epoxy-1,2-cyclohexanedicarboxyimide); and polyepoxy compounds such as N,N',N''-triglycidyl isocyanurate, 1,3,5-tri(1,2-epoxyethyl)benzene, tetra-p-glycidoxytetraphenylethane, and polyglycidyl ethers of phenol-formaldehyde novolak resins and cresol-formaldehyde novolak resins such as EOCN-102 S (trade name of an epoxy compound manufactured by Nihon Kayaku K.K., Japan). An epoxy compound having a hydantoin skeletal structure or a halogen-containing epoxy compound such as a halogenated epoxy compound of one of the above-mentioned epoxy compounds may also be used in the process of the present invention. Specific examples of the epoxy compound having a hydantoin skeletal structure include XB-2818 and XB-2793 (trade names of epoxy compounds manufactured by Ciba-Geigy AG, Switzerland). Specific examples of the halogen-containing epoxy compound include DER-542 and DER-511 (trade names of epoxy compounds manufactured by The Dow Chemical Company, U.S.A.); Araldite 8011 (trade name of an epoxy compound manufactured by Ciba-Geigy AG, Switzerland); and Epikote 1045 (trade name of an epoxy compound manufactured by Yuka Shell Epoxy K.K., Japan). The above-mentioned epoxy compounds may be used either alone or in combination. When the epoxy compound (D) is polymeric, its weight average molecular weight is in the range of up to 5,000, preferably in the range of from 150 to 5,000, more preferably in the range of from 200 to 4,000, most preferably in the range of from 300 to 3,000. For the measurement of a weight average molecular weight, there is adopted a gel permeation chromatography (GPC) method using, as standard samples, polystyrenes manufactured by Pressure Chemical CO., U.S.A. and as an apparatus, WATERS 200 manufactured by Japan-Waters Co., Japan. The epoxy compound (D) preferably has 1 to 30 epoxy groups, more preferably 1 to 20 epoxy groups, most preferably 1 to 15 epoxy groups.

The weight proportion of the polyfunctional maleimide compound (A) relative to the total of the polyfunctional maleimide compound (A) and the bis-maleimide (B) is required to be 3% or more in the process of the present invention so as to provide a maleimide type prepolymer capable of being dissolved in a low boiling point solvent such as acetone, methyl ethyl ketone or methyl cellosolve to give a solution having a solids concentration of 40% by weight or more. The lower limit of the above-mentioned weight proportion is preferably 5%, more preferably 10%. In order to assure long pot life of a varnish containing a maleimide type prepolymer, the weight proportion of the polyfunctional maleimide compound (A) relative to the total of the polyfunctional maleimide compound (A) and the bis-maleimide (B) is required to be 80% or less, preferably 70% or less, more preferably 60% or less, in the process of the present invention.

The molar ratio of the total of the polyfunctional maleimide compound (A) and the bis-maleimide (B) relative to the diamine (C) is in the range of from 1:2 to 1:0.1, preferably in the range of from 1:1 to 1:0.15, more preferably in the range of from 1:0.6 to 1:0.2, in the process of the present invention. Where the above-mentioned molar ratio is less than 1:2, a reaction involving the polyfunctional maleimide compound (A), the bis-maleimide (B) and the diamine (C) proceeds too fast, and, hence, it is difficult to control the reaction and the resulting prepolymer tends to be poor in solubility in low boiling point organic solvents such as acetone. Where the above-mentioned molar ratio is more than 1:0.1, the above-mentioned reaction proceeds too slowly and, in addition, the resulting prepolymer tends to be poor not only in solubility in low boiling point organic solvents but also in curability.

The weight proportion of the epoxy compound (D) relative to the total of the polyfunctional maleimide compound (A), the bis-maleimide (B), the diamine (C) and the epoxy compound (D) is in the range of from 5 to 80%, preferably in the range of from 10 to 70%, more preferably in the range of from 15 to 60%, in the process of the present invention. Where the above-mentioned weight proportion is smaller than 5%, the curability of the resulting prepolymer is so poor that it may take a long time to cure the prepolymer. Where the above-mentioned weight proportion is larger than 80%, the resulting prepolymer, upon heat-curing, forms a polyimide which is poor in heat resisting properties and does not satisfy the requirements for being classified V-1 in tests for flammability according to Underwriters Laboratories' Standard-94 (vertical burning test).

The polyfunctional maleimide compound (A) may contribute to an improvement in some of the heat resisting properties of a polyimide formed by curing a maleimide type prepolymer prepared according to the process of the present invention, leading to a rise of the glass transition temperature of the polyimide and to a reduction of the thermal degradation of the polyimide. This may be so because the above-mentioned polyimide has a higher degree of crosslinking due to the polyfunctionality of the polyfunctional maleimide compound (A) than a polyimide formed from a bis-maleimide-diamine-epoxy prepolymer prepared without any polyfunctional maleimide compound.

The epoxy compound (D) contributes to an improvement in the curability of a maleimide type prepolymer prepared according to the process of the present invention, with the result that the prepolymer can be readily cured to a sufficient degree by heating the same in a shorter period of time than a polyfunctional maleimide-bis-maleimide-diamine prepolymer prepared without any epoxy compound. The epoxy compound (D) also contributes to an improvement in the solubility of the maleimide type prepolymer in low boiling point organic solvents such as acetone. This is apparent from the following experimental fact. A prepolymer prepared at a weight proportion of the polyfunctional maleimide compound (A) relative to the polyfunctional maleimide compound (A) and the bis-maleimide (B) of 3 to 10% according to the process of the present invention is satisfactory in solubility in low boiling point organic solvents such as acetone, while a prepolymer prepared in substantially the same manner as in the preparation of the above-mentioned prepolymer except for omission of use of the epoxy compound (D) is relatively poor in solubility in low boiling point organic solvents such as acetone.

The process of the present invention may comprise either one step of a reaction to which all the starting materials (A), (B), (C) and (D) are subjected at a time, or a few steps of reactions to which the starting materials (A), (B), (C) and (D) are sequentially subjected in any order. In the process of the present invention, a reaction or reactions involving the epoxy compound (D) are carried out at a temperature of 50° to 145° C. for a period of time of 5 to 240 minutes, preferably at 60° to 140° C. for 10 to 150 minutes, more preferably at 70° to 135° C. for 15 to 90 minutes. When the process of the present invention comprises a reaction or reactions not involving the epoxy compound (D), the reaction or reactions are carried out at a temperature of 70° to 180° C. for a period of time of 5 to 240 minutes, preferably at 90° to 160° C. for 10 to 180 minutes, more preferably at 100° to 150° C. for 20 to 90 minutes. A reaction or reactions involved in the process of the present invention may be effected either in the molten state of the materials or in the dissolved state of the materials in a solvent such as, e.g., 2-methoxyethanol (i.e. methyl cellosolve), 2-ethoxyethanol (i.e. ethyl cellosolve), 2-(methoxymethoxy)ethanol, 2-isopropoxyethanol, 2-(ethoxyethoxy)ethanol, 2-acetoxyethanol, 2-acetoxymethylethanol, dioxane, dimethyldioxane, propylene glycol monomethyl ether or a mixture thereof. The amount of the organic solvent, if used, is usually in the range of up to 80% by weight based on the reaction mixture. Preferred are 2-methoxyethanol, 2-ethoxyethanol, 2-(methoxymethoxy)ethanol, 2-isopropoxyethanol and mixtures thereof. When a solvent is used, the reaction mixture containing the solvent and a prepolymer may be either used by itself as a varnish or formulated into a suitable form of varnish. The use of the solvent in the practice of the process of the present invention is preferred in that it provides a uniform advance of the reaction or reactions, and that it widens the scopes of the kinds and ratio of starting materials usable in the production of prepolymers because starting materials even in a solid state at reaction temperatures may be used in so far as they are soluble in the solvent at the reaction temperatures, which is true particularly of a solid epoxy compound having a relatively large molecular weight.

The preferred embodiments of practicing the process of the present invention will be mentioned as follows.

[1] All the starting materials (A), (B), (C) and (D) are reacted at a time.

[2] The polyfunctional maleimide compound (A), the bismaleimide (B) and the diamine (C) are preliminarily reacted. Subsequently, the epoxy compound (D) is added thereto, and the resulting mixture is subjected to a second step reaction.

[3] the diamine (C) and the epoxy compound (D) are preliminarily reacted. Subsequently, the polyfunctional maleimide compound (A) and the bis-maleimide (B) are added thereto, and the resulting mixture is subjected to a second step reaction.

[4] The diamine (C) and the epoxy compound (D) are preliminarily reacted. Subsequently, the polyfunctional maleimide compound (A) is added thereto, and the resulting mixture is subjected to a second step reaction. The bis-maleimide (B) is then added to the reaction mixture obtained after the second step reaction, and the resulting mixture is subjected to a third step reaction.

[5] The diamine (C) and the epoxy compound (D) are preliminarily reacted. Subsequently, the bis-maleimide (B) is added thereto, and the resulting mixture is subjected to a second step reaction. The polyfunctional maleimide compound (A) is added to the reaction mixture obtained after the second step reaction, and the resulting mixture is subjected to a third step reaction.

Since the maleimide type prepolymer prepared according to the process of the present invention can be dissolved very well in a low boiling point organic solvent such as methyl ethyl ketone or acetone to prepare a varnish, the preparation of prepregs and copper-clad laminated boards therefrom can be carried out using this maleimide type prepolymer according to substantially the same procedures as employed for the preparation of ordinary epoxy type prepregs and copper-clad laminated boards therefrom which preparation is easy to carry out due to good workability. A varnish containing the prepolymer prepared according to the process of the present invention and a low boiling point solvent is hardly subject to sagging when applied to a base material unlike a varnish containing a conventional amino-bis-maleimide prepolymer and a high boiling point solvent such as N-methyl-2-pyrrolidone, and contributes to a drastic decrease in amounts of volatile matters remaining in the prepregs and the copper-clad laminated boards prepared therefrom.

The solubility of the prepolymer prepared according to the process of the present invention may vary depending on the kinds of raw materials from which the prepolymer has been prepared, the reaction conditions under which the preparation of the prepolymer has been carried out, the kind of organic solvent in which the prepolymer is to be dissolved, and so forth. However, the prepolymer prepared according to the process of the present invention can usually be dissolved in a low boiling point organic solvent such as acetone, methyl ethyl ketone or methyl cellosolve in such an amount as to form, at room temperature, a solution having a solids content of about 40% by weight or more.

A curing agent may be used in combination with the maleimide type prepolymer prepared according to the process of the present invention for improving curability of the prepolymer. As the curing agent, there can be mentioned, for example, dicyandiamide, guanidine, tetramethylguanidine, benzoguanamine and various diamines as mentioned as the diamine component (B) in the process of the present invention. The curing agent is usually used in an amount of 0.5 to 15 parts by weight per 100 parts by weight of the prepolymer.

The following Examples illustrate the present invention in more detail but should not be construed as limiting the scope of the invention.

In the following Examples, all "parts" are by weight.

EXAMPLE 1

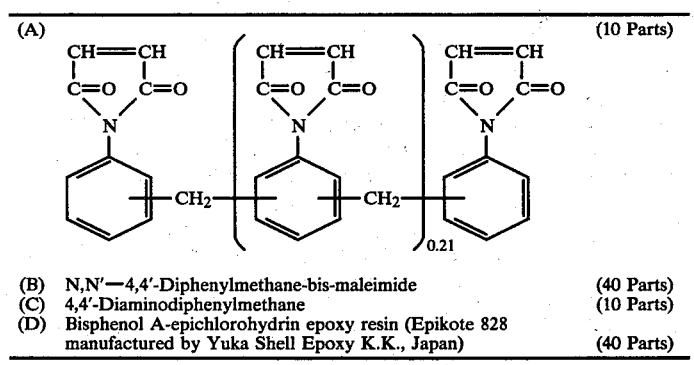

| | | |
|---|---|---|
| (A) | | (10 Parts) |
| (B) | N,N'—4,4'-Diphenylmethane-bis-maleimide | (40 Parts) |
| (C) | 4,4'-Diaminodiphenylmethane | (10 Parts) |
| (D) | Bisphenol A-epichlorohydrin epoxy resin (Epikote 828 manufactured by Yuka Shell Epoxy K.K., Japan) | (40 Parts) |

The above-mentioned four components were reacted in the molten state at 90° to 120° C. for 40 minutes to obtain a reddish and transparent prepolymer. The prepolymer thus obtained could be dissolved in each of acetone, methyl ethyl ketone and methyl cellosolve to give a solution having a solids content exceeding 50% by weight.

Then, 100 parts of the prepolymer thus obtained and 1.5 parts of dicyandiamide were dissolved in a mixed solvent of methyl ethyl ketone and methyl cellosolve (mixing weight ratio=6:4) to prepare a varnish having a solids contents of about 50% by weight.

EXAMPLE 2

| | | |
|---|---|---|
| (A) | [chemical structure: tris-maleimide with CH₂ bridges, subscript 0.35] | (5 Parts) |
| (B) | N,N'—4,4'-Diphenylmethane-bis-maleimide | (45 Parts) |
| (C) | Benzoquanamine | (6 Parts) |
| | 4,4'-Diaminodiphenylmethane | (8 Parts) |
| (D) | Phenol novolak type epoxy resin (DEN-438 manufactured by The Dow Chmeical Company, U.S.A.) | (35 Parts) |

The above-mentioned three components (A), (B) and (C) were heated together with 50 parts of methyl cellosolve as a solvent at 120° C. for 30 minutes to effect the reaction. Then, the above-mentioned component (D) was added to the reaction mixture, and the resulting mixture was heated at 90° C. for 30 minutes. The resulting reaction mixture was cooled to room temperature, and 50 parts of methyl ethyl ketone was added thereto to prepare a reddish and transparent varnish having a solids content of about 50% by weight.

EXAMPLE 3

| | | |
|---|---|---|
| (A) | [chemical structure: tris-maleimide with CH₂ bridges, subscript 0.5] | (20 Parts) |
| (B) | N,N'—4,4'-Diphenyl-ether-bis-maleimide | (30 Parts) |
| (C) | 4,4'-Methylenebis(2-chloroaniline) | (10 Parts) |
| | 4,4'-Diaminodiphenylmethane | (2 Parts) |
| (D) | Hydantoin type epoxy resin (XB-2818 manufactured by Ciba-Geigy AG, Switzerland) | (60 Parts) |

The above-mentioned four components (A), (B), (C) and (D) were heated together with 60 parts of methyl cellosolve as a solvent at 80° to 120° C. for 50 minutes to effect the reaction. The reaction mixture was cooled to room temperature, and 2 parts of dicyandiamide and 64 parts of methyl ethyl ketone were added thereto to prepare a reddish and transparent varnish having a solids content of about 50% by weight.

EXAMPLE 4

| | | |
|---|---|---|
| (A) | [chemical structure: tris-maleimide with CH₂ bridges, subscript 1.5] | (3 Parts) |
| (B) | N,N'—Methylenebis(3-chloro-p-phenylene)-bis-maleimide | (30 Parts) |
| | N,N'—4,4'-Diphenylmethane-bis-maleimide | (17 Parts) |
| (C) | 4,4'-Diaminodiphenylmethane | (10 Parts) |
| (D) | Phenol novolak type epoxy resin (DEN-438) | (40 Parts) |

The above-mentioned three components (A), (B) and (C) were reacted in the molten state at 110° to 130° C. for 20 minutes. Then, the above-mentioned component (D) was added thereto, and the resulting mixture was heated in the molten state at 100° to 110° C. for 15 minutes to obtain a reddish and transparent prepolymer.

The prepolymer thus obtained could be dissolved in each of acetone, methyl ethyl ketone and methyl cellosolve to give, at room temperature, a solution having a solids content exceeding 50% by weight.

Then, 100 parts of the prepolymer thus obtained and 8 parts of benzoguanamine were dissolved in a mixed solvent of methyl ethyl ketone and methyl cellosolve (mixing weight ratio=6:4) to prepare a varnish having a solids content of about 50% by weight.

EXAMPLE 5

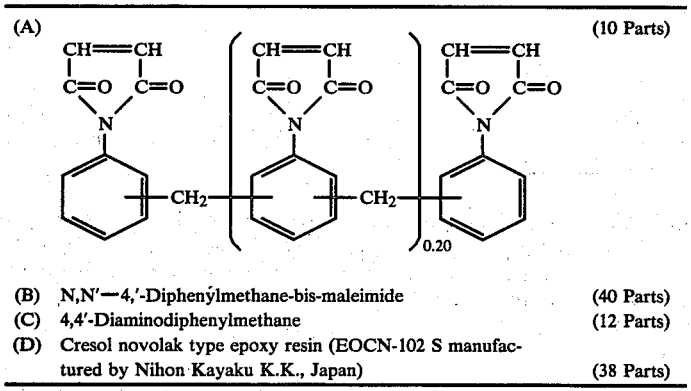

(A) (10 Parts)

(B) N,N'—4,'-Diphenylmethane-bis-maleimide (40 Parts)
(C) 4,4'-Diaminodiphenylmethane (12 Parts)
(D) Cresol novolak type epoxy resin (EOCN-102 S manufactured by Nihon Kayaku K.K., Japan) (38 Parts)

The above-mentioned three components (A), (B) and (C) were reacted together with 50 parts of methyl cellosolve as a solvent at 110° to 125° C. for 30 minutes. Then, the above-mentioned component (D) was added to the reaction mixture, and the resulting mixture was heated at 80° to 100° C. for 30 minutes. The resulting reaction mixture was cooled to room temperature, and 50 parts of methyl ethyl ketone and 1.5 parts by weight of dicyandiamide were added thereto to prepare a reddish and transparent varnish having a solids content of about 50% by weight.

Aminosilane-treated glass cloth WE-18G-104BX (trade name of a glass cloth manufactured by Nittobo K.K., Japan) of 0.18 mm in thickness was impregnated with each of the varnishes prepared in Examples 1 to 5, followed by drying at 110° to 130° C. for 10 minutes to prepare a prepreg. The remaining volatile content of every prepreg thus prepared was lower than 0.2% by weight.

COMPARATIVE EXAMPLES 1 TO 5

Two kinds of prepolymers each was prepared from only the components (B) and (C) as used in each of Examples 1 and 4 under substantially the same reaction conditions as in the corresponding Example, and the components (A) and (D) as used in each of Examples 1 and 4 were blended, at room temperature, with the corresponding prepolymer thus prepared without causing the heat reaction. Thus, two kinds of mixtures which were respectively the same in starting materials as the prepolymers prepared in Examples 1 and 4 were obtained. The solubility at room temperature of each mixture in each of acetone, methyl ethyl ketone and methyl cellosolve was lower than 10% by weight based on the total of the mixture and the solvent. Accordingly, 100 parts by weight of each of the mixtures was dissolved in highly dipolar N-methyl-2-pyrrolidone having a boiling point of 202° C., and 1.5 parts by weight of dicyandiamide and 8 parts by weight of benzoguanamine were respectively dissolved in the resulting solutions containing one of the mixtures respectively corresponding to the prepolymers prepared in Examples 1 and 4. Thus, two kinds of varnishes having a solids content of about 50% by weight were obtained.

Three kinds of varnishes each was prepared in substantially the same manner as in each of Examples 2, 3 and 5 except that the components (A) and (D) were simply mixed, at room temperature, with a reaction mixture containing a prepolymer prepared from only the components (B) and (C) under substantially the same reaction conditions as in the corresponding Example, instead of being involved in the reaction. Every varnish contained more than 20% by weight of insoluble matters at room temperature. Accordingly, with respect to every varnish, the mixed solvent of methyl ethyl ketone and methyl cellosolve was replaced with N-methyl-2-pyrrolidone to prepare a varnish having a solids content of about 50% by weight and containing substantially no insoluble matters.

Comparative Examples 1 to 5 correspond to Examples 1 to 5, respectively, in respect of starting materials.

By using each of the varnishes prepared in Comparative Examples 1 to 5, a prepreg was prepared in substantially the same manner as in Examples 1 to 5 except that the drying temperature was 150° to 160° C. In spite of the higher drying temperature, the remaining volatile content of every prepreg thus prepared was 0.8 to 1.2% by weight which was much higher than those (lower than 0.2% by weight) of the prepregs respectively prepared from the prepolymers of Examples 1 to 5.

Laminated boards were prepared by using the varnishes prepared in Examples 1 to 5 and Comparative Examples 1 to 5, respectively, in the following manner.

Eight strips of 0.18 mm-thick aminosilane-treated glass cloth WE-18G-104BX were impregnated with the varnish, followed by drying at 110° to 130° C. in the case of each varnish prepared in Examples or at 150° to 160° C. in the case of each varnish prepared in Comparative Examples for 10 minutes, to prepare eight strips of a prepreg having a resin content of about 45% by weight. The eight strips of the prepreg were contact-bonded at 170° C. under a pressure of 40 kg/cm² for 50 minutes, followed by post-curing at 200° C. for 50 minutes, to prepare a laminated board having a thickness of about 1.6 mm.

For the purposes of comparison, a laminated board (Comparative Example 6) was prepared in substantially the same manner as in Comparative Examples 1 to 5 except that Kerimid 601 (trade name of an amino-bis-maleimide type prepolymer manufactured by Rhone-Poulenc S.A., France) was dissolved in N-methyl-2-pyrrolidone to prepare a varnish and the contactbonding was carried out at 180° C. for 75 minutes, followed by post-curing at 220° C. for 180 minutes.

The properties of the laminated boards thus prepared are shown in Table 1, together with the properties of 1.6 mm-thick glass-epoxy laminated board LE-61 (trade name of a glass-epoxy laminated board manufactured in accordance with NEMA G-10 by Hitachi Chemical Company Ltd., Japan) as another comparative laminated board (Comparative Example 7).

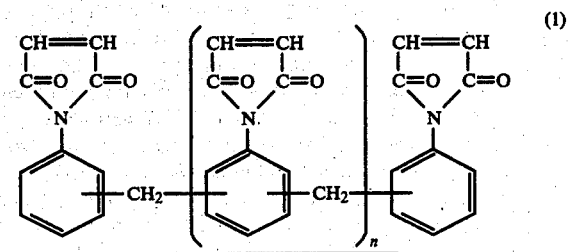

(1)

TABLE 1

|  |  | Example Nos. |  |  |  |  | Comparative Example Nos. |  |  |  |  |  |
|---|---|---|---|---|---|---|---|---|---|---|---|---|
|  |  | 1 | 2 | 3 | 4 | 5 | 1 | 2 | 3 | 4 | 5 | 6 | 7 |
| Contact-Bonding | Temperature (°C.) | 170 | 170 | 170 | 170 | 170 | 170 | 170 | 170 | 170 | 170 | 180 | 170 |
| Conditions | Time (minutes) | 50 | 50 | 50 | 50 | 50 | 50 | 50 | 50 | 50 | 50 | 75 | 60 |
| Post-Curing | Temperature (°C.) | 200 | 200 | 200 | 200 | 200 | 200 | 200 | 200 | 200 | 200 | 220 | — |
| Conditions | Time (minutes) | 50 | 50 | 50 | 50 | 50 | 50 | 50 | 50 | 50 | 50 | 180 | — |
| Starting Temperature of Weight Decrease (°C.) |  | 400 | 405 | 395 | 400 | 403 | 390 | 395 | 380 | 395 | 395 | 405 | 340 |
| Weight Decrease till 500° C. (%) |  | 23 | 20 | 25 | 22 | 20 | 25 | 26 | 28 | 25 | 22 | 20 | 65 |
| Glass Transition Temperature (°C.) |  | 230 | 220 | 230 | 225 | 230 | 230 | 220 | 230 | 225 | 230 | 220 | 120 |
| Flexural Strength at 20° C. (Kg/mm$^2$) |  | 55 | 58 | 60 | 55 | 57 | 53 | 55 | 57 | 55 | 56 | 60 | 55 |
| Relative | 100° C. | 95 | 96 | 95 | 94 | 95 | 95 | 95 | 94 | 94 | 95 | 85 | 70 |
| Flexural | 150° C. | 90 | 88 | 90 | 90 | 89 | 90 | 88 | 90 | 88 | 88 | 80 | 45 |
| Strength (%) | 180° C. | 84 | 82 | 85 | 84 | 85 | 85 | 82 | 85 | 83 | 83 | 75 | — |
|  | 220° C. | 80 | 76 | 79 | 80 | 80 | 78 | 75 | 80 | 78 | 80 | 65 | — |
| Relative | 500 hrs | 100 | 100 | 100 | 100 | 100 | 100 | 100 | 100 | 100 | 100 | 100 | — |
| Flexural | 1000 hrs | 96 | 95 | 95 | 96 | 95 | 92 | 90 | 91 | 92 | 90 | 85 | — |
| Strength | 1500 hrs | 88 | 84 | 85 | 86 | 86 | 84 | 80 | 82 | 82 | 80 | 77 | — |
| after Heat Treatment (%) | 2000 hrs | 80 | 77 | 80 | 75 | 78 | 72 | 70 | 71 | 73 | 72 | 60 | — |
| Boiling Water Absorption (%) |  | 0.18 | 0.20 | 0.18 | 0.17 | 0.18 | 0.43 | 0.45 | 0.40 | 0.45 | 0.43 | 0.65 | 0.20 |
| Flammability |  | V-1 | V-1 | V-0 | V-1 | V-1 | HB | V-1 | V-1 | V-1 | V-1 | V-0 | HB |

Note
Testing Methods
(1) Flexural Strength: According to JIS (Japanese Industrial Standard) C 6481
(2) Relative Flexural Strength: Flexural Strength at a given temperature relative to flexural strength at 20° C.
(3) Relative Flexural Strength after Heat Treatment: Flexural strength (at 180° C.) after heating at 220° C. for a given time relative to flexural strength (at 180° C.) before the heating
(4) Starting Temperature of Weight Decrease and Weight Decrease till 500° C.: According to heat weight-decrease analysis using a thermobalance in air at a temperature-increasing rate of 5° C./minute
(5) Flammability: According to Underwriters Laboratories' Standard-94 (vertical burning test)
(6) Boiling Water absorption: According to JIS K 6911

As is apparent from Table 1, the laminated boards prepared by using the prepolymers obtained according to the process of the present invention are comparable in heat resistance to and better in boiling water absorption than the laminated board prepared by using Kerimid 601, and better in heat resistance than the glass-epoxy laminated board LE-61. The prepolymers obtained according to the process of the present invention are advantageous over Kerimid 601 in that they can be used in the form of a solution thereof in a cheaper and low boiling point solvent such as acetone, methyl ethyl ketone or methyl cellosolve for the production of laminated boards.

What is claimed is:

1. A process for preparing a thermosetting maleimide prepolymer, which comprises reacting (A) a polyfunctional maleimide compound obtained by the dehydration reaction of an amide acid formed from maleic anhydride and a polyamine prepared by the condensation of aniline with formaldehyde and represented by the formula (1) wherein n is in the range of from 0.1 to 3.0, (B) at least one bis-maleimide selected from the group consisting of N,N'-m-phenylene-bis-maleimide, N,N'-p-phenylene-bis-maleimide, N,N'-4,4'-diphenylmethane-bis-maleimide, N,N'-4,4'-diphenyl-ether-bis-maleimide, N,N'-methylene-bis(3-chloro-p-phenylene)-bis-maleimide, N,N'-4,4'-diphenylsulfone-bis-maleimide, N,N'-m-xylene-bis-maleimide and N,N'-4,4'-diphenylcyclohexane-bis-maleimide, (C) at least one diamine selected from the group consisting of m-phenylenediamine, p-phenylenediamine, 4,4'-diaminodiphenylmethane, 2,2'-bis(4-aminophenyl)propane, benzidine, 4,4'-diaminodiphenylsulfone, bis(4-aminophenyl)methylphosphine oxide, bis(4-aminophenyl)phenylphosphine oxide, bis(4-aminophenyl)methylamine, 1,5-diaminonaphthalene, m-xylylenediamine, p-xylylenediamine, 4,4'-diaminobenzophenone, 4,4'-diaminoazobenzene, bis(4-aminophenyl)phenylmethane, 1,1-bis(4-aminophenyl)cyclohexane, 1,1-bis(4-amino-3-methylphenyl)cyclohexane, 2,5-bis(m-aminophenyl)-1,3,4-oxadiazole, 2,5-bis(p-aminophenyl)-1,3,4-oxadiazole, 2,5-bis(m-aminophenyl)thiazolo(4,5-d)thiazole, 5,5'-di(m-aminophenyl)-2,2'-bis(1,3,4-oxadiazolyl), 4,4'-diaminodiphenyl ether, 4,4'-bis(p-aminophenyl)-2,2'-dithiazole, m-bis(4-p-aminophenyl-2-thiazolyl)benzene, 4,4'-diaminobenzanilide, 4,4'-diaminophenyl benzoate, N,N'-bis(4-aminobenzyl)-p- phenylenediamine and 4,4'-methylenebis(2-chloroaniline), wherein the weight proportion of said polyfunctional maleimide compound (A) relative to the total of said polyfunctional maleimide compound (A) and said at least one bis-maleimide (B) is 3 to 80%, and the molar ratio of the total of said polyfunctional maleimide compound (A) and said at least one bis-maleimide (B) relative to said at least one diamine (C) is 1:2 to 1:0.1, said process further comprising a reaction with (D) at least one 1,2-epoxy compound which, when polymeric, has a weight average molecular weight of up to 5,000, and the process comprising the reaction between (A), (B), (C) and (D) being performed in one or more stages, provided that in any stage involving a reaction in which said at least one 1,2-epoxy compound (D) participates, the reaction is effected at a temperature of 50° to 145° C. for a period of time of 5 to 240 minutes and that in any stage involving a reaction in which said at least one 1,2-epoxy compound (D) does not participate, the reaction is effected at a temperature of 70° to 180° C. for a period of time of 5 to 240 minutes, and wherein the weight proportion of said at least one 1,2-epoxy compound (D) relative to the total of said polyfunctional maleimide compound (A), said at least one bis-maleimide (B), said at least one diamine (C) and said at least one 1,2-epoxy compound (D) is 5 to 80%.

2. A process according to claim 1, wherein said polyfunctional maleimide compound (A), said at least one bis-maleimide (B) and said at least one diamine (C) are reacted, followed by reacting the resulting reaction mixture with said at least one 1,2-epoxy compound (D).

3. A process according to claim 1, wherein said reaction between (A), (B), (C) and (D) is performed in the dissolved state of the materials in a solvent.

4. A process according to claim 1, wherein said reaction in which said at least one 1,2-epoxy compound (D) participates is effected at a temperature of 60° to 140° C. for a period of time of 10 to 150 minutes.

5. A thermosetting maleimide prepolymer produced by a process according to claim 1.

6. A thermosetting maleimide prepolymer produced by a process according to claim 2.

7. A thermosetting maleimide prepolymer produced by a process according to claim 3.

8. A thermosetting maleimide prepolymer produced by a process according to claim 4.

* * * * *